United States Patent
Lee et al.

(10) Patent No.: US 9,940,980 B2
(45) Date of Patent: Apr. 10, 2018

(54) HYBRID LPDDR4-DRAM WITH CACHED NVM AND FLASH-NAND IN MULTI-CHIP PACKAGES FOR MOBILE DEVICES

(71) Applicant: Futurewei Technologies, Inc., Plano, TX (US)

(72) Inventors: Xiaobing Lee, Santa Clara, CA (US); Feng Yang, Portland, OR (US); Yu Meng, Shenzhen (CN); Yunxiang Wu, Cupertino, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/199,802

(22) Filed: Jun. 30, 2016

(65) Prior Publication Data

US 2018/0005670 A1    Jan. 4, 2018

(51) Int. Cl.
| | |
|---|---|
| *G11C 7/10* | (2006.01) |
| *G06F 3/06* | (2006.01) |
| *G06F 11/14* | (2006.01) |
| *G11C 5/04* | (2006.01) |
| *G06F 12/02* | (2006.01) |
| *G11C 8/18* | (2006.01) |
| *G06F 13/16* | (2006.01) |

(52) U.S. Cl.
CPC .............. *G11C 7/10* (2013.01); *G06F 3/061* (2013.01); *G06F 3/0644* (2013.01); *G06F 3/0647* (2013.01); *G06F 3/0655* (2013.01); *G06F 3/0685* (2013.01); *G06F 11/1469* (2013.01); *G11C 5/04* (2013.01); *G11C 7/1072* (2013.01); *G06F 12/0246* (2013.01); *G06F 13/1673* (2013.01); *G11C 8/18* (2013.01)

(58) Field of Classification Search
CPC .... G06F 3/061; G06F 11/1469; G06F 3/0685; G06F 3/0655; G06F 3/0644; G06F 13/1673; G06F 12/0246; G11C 5/04; G11C 7/1072; G11C 8/18
See application file for complete search history.

(56) References Cited

U.S. PATENT DOCUMENTS

| | | | |
|---|---|---|---|
| 9,529,710 B1* | 12/2016 | Jones | G06F 12/0246 |
| 2013/0329491 A1* | 12/2013 | Chang | G11C 5/04 |
| | | | 365/185.03 |
| 2014/0201423 A1* | 7/2014 | Jean | G06F 12/0246 |
| | | | 711/103 |
| 2016/0232112 A1* | 8/2016 | Lee | G06F 13/1673 |
| 2016/0239240 A1* | 8/2016 | Wu | G06F 11/1469 |
| 2017/0133070 A1* | 5/2017 | Ware | G11C 8/18 |

* cited by examiner

*Primary Examiner* — Ajay Ojha
(74) *Attorney, Agent, or Firm* — Schwegman Lundberg & Woessner, P.A.

(57) ABSTRACT

An apparatus comprises a hybrid-memory multi-chip package (MCP) including a non-volatile memory (NVM) in an NVM die; a dynamic random access memory (DRAM) in two or more DRAM die, wherein a portion of the DRAM is allocated as a cache memory for the NVM; and a hybrid controller for the NVM and DRAM. The hybrid controller includes an NVM interface to the NVM; a DRAM interface to the cache memory; a host interface to communicate data with a host processor, wherein the host interface includes a parallel data bus for reading and writing data directly with both of the DRAM and the NVM; and logic circuitry configured to interleave access by the host processor and hybrid controller to the DRAM and NVM.

11 Claims, 18 Drawing Sheets

| COMMAND | | CS | SDR CA PINS | | | | | | CK EDGE |
|---|---|---|---|---|---|---|---|---|---|
| | | | CA0 | CA1 | CA2 | CA3 | CA4 | CA5 | |
| 420~ | ACT₁ | H | H | L | R12 | R13 | R14 | R15 | ↑1 |
| | | L | BA0 | BA1 | BA2 | BA3 | R10 | R11 | ↓2 |
| 422~ | ACT₂ | H | H | H | R6 | R7 | R8 | R9 | ↑1 |
| | | L | R0 | R1 | R2 | R3 | R4 | R5 | ↓2 |
| 440~ | WRITE₁ | H | L | L | H | L | L | BL | ↑1 |
| | | L | BA0 | BA1 | BA2 | V | C9 | AP | ↓2 |
| 460~ | READ₁ | H | L | H | L | L | L | BL | ↑1 |
| | | L | BA0 | BA1 | BA2 | V | C9 | AP | ↓2 |
| 442~ | WRITE₂ READ₂ | H | L | H | L | L | H | C8 | ↑1 |
| | | L | C2 | C3 | C4 | C5 | C9 | C7 | ↓2 |

| COMMAND | CS | CA0 | CA1 | CA2 | CA3 | CA4 | CA5 |
|---|---|---|---|---|---|---|---|
| ACT₁ | H | H | L | CMD3 | CMD2 | CMD1 | CMD0 |
| | L | L | BA[3] | BA[2] | BA[1] | BA[0] | A[25] |
| ACT₂ | H | H | L | A[24] | A[23] | A[22] | A[21] |
| | L | H | A[20] | A[19] | A[18] | A[17] | A[16] |
| ACT₃ | H | H | H | A[15] | A[14] | A[13] | A[12] |
| | L | L | A[11] | A[10] | A[9] | A[8] | A[7] |
| ACT₄ | H | H | H | A[6] | A[5] | A[4] | A[3] |
| | L | H | A[2] | A[1] | A[0] | BA[0] | A[25] |

*FIG. 4*

HYBRID LPDDR4-DRAM WITH CACHED NVM AND FLASH-NAND IN MULTI-CHIP PACKAGES FOR MOBILE DEVICES

TECHNICAL FIELD

The present application is related to memory management in an electronic system, and in particular to protocols used to access memory of different types that are incorporated in a multi-chip package for mobile applications.

BACKGROUND

Multi-chip packages (MCPs) can include dynamic random access memory (DRAM) and non-volatile memory (NVM) such as flash memory. For example, mobile devices (e.g., smartphones, tablet computers, etc.) include both DRAM and NVM in an MCP to preserve space. In general, the DRAM and flash memory each use a separate independent interface to communicate with another device such as a central processor unit (CPU). The access time to the NVM is generally slower than access times for DRAM. The CPU itself may buffer frequently used blocks of data of the DRAM and flash memory, and perform buffer management functions. There are general needs for devices, systems and methods that provide an improved interface between the CPU and memory MCPs.

SUMMARY

As explained above, mobile device manufacturers include both DRAM and NVM in a multi-chip package (MCP) to preserve space. Low power double data rate DRAM (LPDDR) memory continues to improve and memory manufacturers have developed third and fourth generation LPDDR (LPDDR3 and LPDDR4). A central processor unit (CPU) or system on chip (SoC) is often configured by programming to buffer frequently used blocks of data of the DRAM and flash memory, and perform buffer management functions. A better approach is to include DRAM and NVM dies in the MCP with a hybrid controller to handle buffering functions for both NVM and DRAM. The present inventors have recognized the advantages of including a cache coherent port for the CPU or SoC to access the memory of the MCP.

An apparatus embodiment includes a hybrid-memory MCP including a non-volatile memory (NVM) in an NVM die; a dynamic random access memory (DRAM) in two or more DRAM die, wherein a portion of the DRAM is allocated as a cache memory for the NVM; and a hybrid controller for the NVM and DRAM. The hybrid controller includes an NVM interface to the NVM; a DRAM interface to the cache memory; a host interface to communicate data with a host processor, wherein the host interface includes a parallel data bus for reading and writing data directly with both of the DRAM and the NVM; and logic circuitry configured to interleave access by the host processor and memory controller to the DRAM and NVM.

Three-dimensional cross point NVM (NVM/3D-XP) memory die may be accessed as a nondeterministic memory with DRAM cache to boost performance, and may be accessed as a block storage device with DRAM buffers in the device drive for better performance and reliability. Three dimensional triple level cell (3D-TLC) Flash dies are block or storage devices enhanced by using the NVM/3D-XP die as write storage cache. The hybrid controller handles both the data bursts in the DRAM and in the NVM/3D-XP dies. The hybrid controller also processes how to mix block storage of data in the NVM/3D-XP die and 3D-TLC flash dies.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

FIG. 4 is a truth table of low power double data rate DRAM (LPDDR4 or LP4) transport (LP4-T) commands for non-deterministic interleaving of NVM transfer traffic and LP4-DRAM traffic using the same LP4-DRAM bus, according to some embodiments;

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
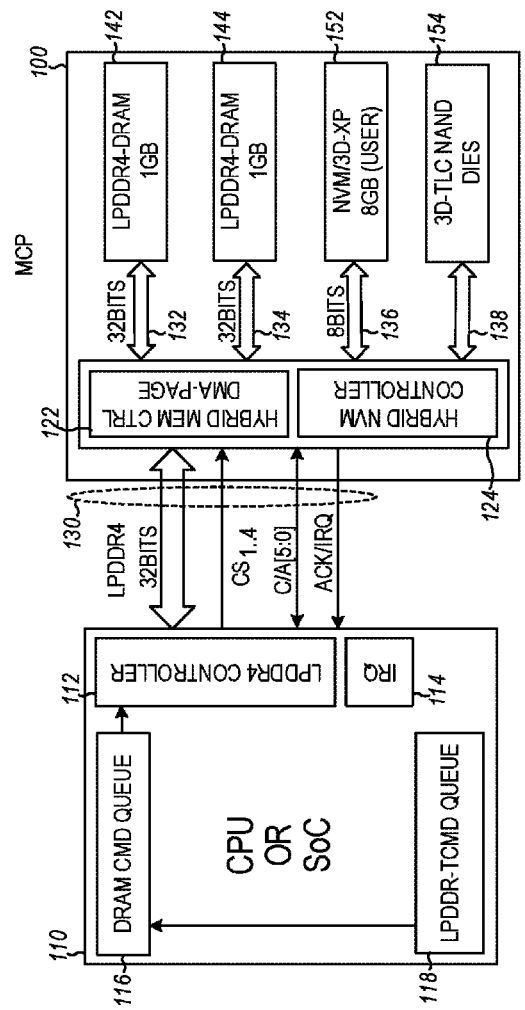
FIG. 1 is a block diagram of a host central processing unit (CPU) and system on chip (SoC) connected to a chip of hybrid memory and storage including two DRAM dies, a non-volatile memory (NVM/3D-XP) die, and according to some embodiments.

FIG. 1 is a block diagram of portions of an embodiment of an electronic system. The system may be included in a mobile computing device (e.g., a tablet computer) or a mobile communications device (e.g., a smart phone). The system includes an MCP 100 and a CPU or SoC 110. The CPU/SoC includes a LPDDR4 (or LP4) memory controller 112, DRAM command queue 116, LPDDR4-T (or LP4-T) command queue 118. An interface 130 between the CPU/SoC and MCP includes an LPDDR4 bus (or LP4 bus) and an acknowledge interrupt request (ACK/IRQ) line. The CPU/SoC also includes an interrupt request queue (IRQ) 114 that is operatively coupled to the ACK/IRQ line. The MCP 100 includes a hybrid memory package of DRAM, NVM and 3D-TLC NAND Flash dies. The DRAM includes two DRAM dies 142, 144, and may be LPDDR (e.g., LPDDR4). The NVM includes an NVM die 152 and may be three-dimensional cross point (3D-XP) or fast Flash NVM. The MCP 100 includes a hybrid memory controller 122 with two 32-bit buses 132, 134 linked two DRAM dies and an 8-bit bus 136 linked to 3D-XP memory/fast Flash 152 to boost the MCP performance. A hybrid NVM controller 124 is included to blend NVM/3D-XP die 152 with 3D-TLC Flash dies 154 thru multiple 8-bit channels 138 to provide a large amount of storage capacity. The interface also includes Chip Select (CS) lines $CS_{1-4}$. $CS_{1,2}$ are used by CPU/SoC to access the DRAM die1 142 and DRAM die2 144, $CS_3$ is used to control access to the hybrid NVM controller that is used to access the NVM/3D-XP die 152 and 3D-TLC NAND die 154, and $CS_4$ is used to schedule the hybrid memory controller 122 for sharing access to the DRAM dies with the CPU/SoC.

Figure 2A:
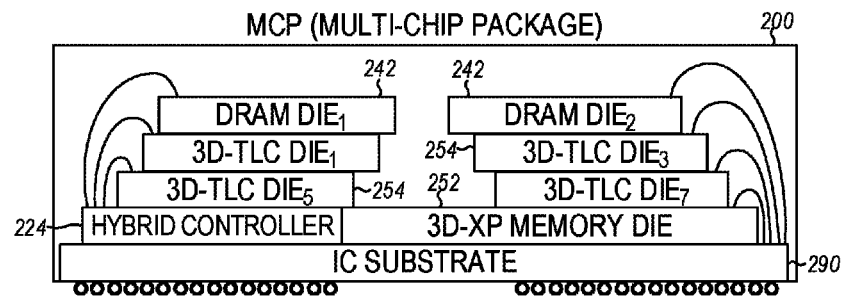
FIG. 2A is an illustration of a multi-chip package (MCP), according to some embodiments.

FIG. 2A is an illustration of an embodiment of an MCP 200. The MCP chip may include two DRAM dies 242, four or eight 3D-TLC dies 254, a hybrid controller die 222, a NVM/3D-XP or fast Flash NVM die 252. The IC memory dies are stacked on top of the IC substrate 290 with conductive interconnections provided to the hybrid controller 220 (hybrid controller refers to both the hybrid memory controller 122 and the hybrid NVM controller 124 of FIG. 1) and BGA soldering balls/pins.

Figure 2B:
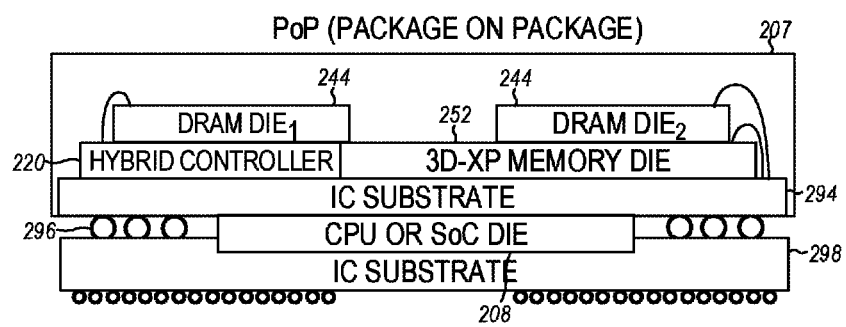
FIG. 2B is an illustration of a package-on-package (PoP) integrated circuit package, according to some embodiments.

FIG. 2B is an illustration of an embodiment of a Package on Package (PoP) approach. The PoP may include a top package 207 and a bottom package 208. The bottom package may include the CPU/SoC die and the top package may include multiple dies of DRAMs 244 and NVM/3D-XP 252 and the hybrid controller 220. One or both of the top package and bottom package may include one or more of stacked integrated circuits (ICs), flip chip mounted ICs, and thin ICs. The substrate 294 of the top package may include conductive interconnections 296 for signals to be communicated between the top package 207 and the bottom package substrate 298. In variations, the PoP top package may not include the 3D-TLC Flash dies because heat from high power CPU/SoC may retention and endurance problems in Flash dies.

Figure 3:
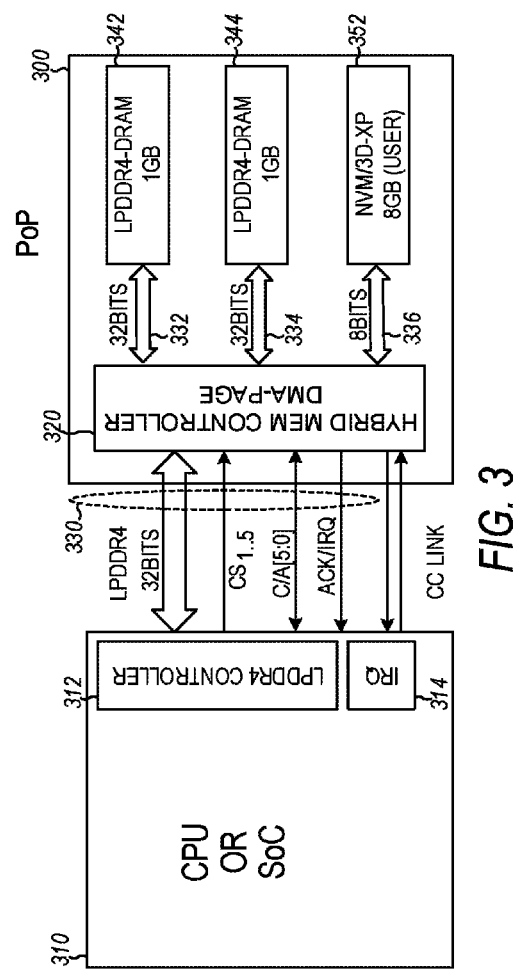
FIG. 3 is a block diagram of a host CPU or SoC linked to a PoP that includes a hybrid memory controller, two DRAM dies, and a NVM/3D-XP die, according to some embodiments.

FIG. 3 is a block diagram of portions of an embodiment of a mobile PoP system to pack hybrid mobile memory dies on top of a mobile CPU/SoC die to reduce package size and cost, and increase performance by eliminating the print circuit board (PCB) that can be a detriment to achieving the LPDDR4 transfer rates. This system includes a CPU/SoC 310 with a LPDDR4 memory controller 312 and Interrupt Request Queue (IRQ) 314, and a PoP memory package 300 with a hybrid controller 320 for memory (NVM and DRAM) and two DRAM dies 342 and 344 plus a NVM/3D-XP die 352. The system also includes two 32-bit (32b) internal buses 332 and 334 in the PoP to connect with the two DRAM dies and an 8-bit bus 336 to link the NVM/3D-XP memory. The hybrid controller 320 may include a DMA-engine to move data pages between the DRAM cache and NVM memory space.

The interface 330 with the hybrid controller 320 includes a 32-bit LPDDR4 bus to connect with the CPU/SoC with chip select (CS) control pins $CS_{1...5}$, where $CS_{1,2}$ are used by CPU/SoC to access the DRAM die 342, $CS_{3,4}$ are used to access the DRAM die 344, and $CS_5$ is used to access the NVM/3D-XP die. The interface also includes a serializer/deserializer (SerDes) cache coherence link (CC link) for nondeterministic NVM/3D-XP traffic. In the event that a match for the data is not found in cache (a cache miss), the hybrid controller 320 receives data from the host via the CC link and transfers the data directly to the NVM. The data transfers over the CC link may be performed as a background operation to transfers of data that involve DRAM.

FIG. 4 is an illustration of an embodiment of an LPDDR4-T (LP4-T) command truth table of DRAM commands for a host to use to implement commands for the NVM or $NVM_{cmd}$. Commands may be transmitted to the hybrid controller using a six-lane command address (C/A) control bus interface that includes pins CA0-CA5. Pins CK, CKE, and CS may be used to control the capture of transmitted data. The $ACT_1$ 420 and $ACT_2$ 440 commands may include 2 20-bit words. $ACT_1$ $ACT_2$ commands are cascaded (e.g., $ACT_1$ $ACT_2$ $ACT_1$ $ACT_2$) in 8 clock cycles to transfer a 36 bit $NVM_{cmd}$ [35:0] command and 4 bit ECC[3:0] or error correction codes. A $NVM_{read}$ command could be implemented as [0000], Bank[3:0], NV address [27:0], and a NVM write command could be implemented as [0010], Bank[3:0], NV address [27:0]. The DRAM $Write_1$ 440 and $Write_2$ 442 commands could setup the control and configuration registers (2048 cases) for the hybrid controller of NVM and DRAM. $Read_1$ 460 and $Read_2$ 442 commands could be used by the host to fetch the transaction and status registers of the hybrid controller for memory, such as for example the hybrid controller's buffer credit register and the NVMe transaction completion queuing registers.

Figure 5A:
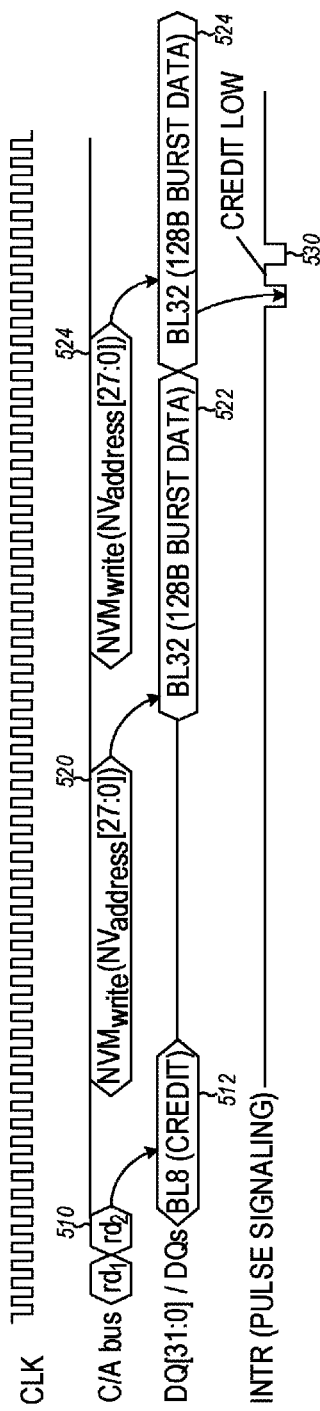
FIG. 5A is a timing diagram of LP4-T write transactions including NVM write operations and interrupt with pulse width error messaging, according to some embodiments.

FIG. 5A is a timing diagram of an embodiment of a LP4-T write-transaction to access the NVM/3D-XP die in memory mode. The host CPU/SoC uses $Read_{1,2}$ ($rd_{1,2}$) commands 510 to read the credit register of the hybrid controller's NVM buffers and obtain the 32 Byte (32 B) buffer credit by using burst-length-8 (BL8) data 512 over the LP4 DQ[7:0]/DQS data bus. The host CPU/SoC may then start an NVM write-transaction by using $ACT_{1,2,1,2}$ command sequences in 8 clock cycles to issue a NVM write command with 28 bit NV address [27:0] using the LP4 Command/Address (C/A) control bus, and using the data bus to transfer the BL32 (32×4 B=128 Byte) data 522 to the MCP. The host CPU/SoC may then continue to send the next $NVM_{write}$ command with NV address [27:0] 524 followed by the 128 Byte data 524, if the hybrid controller buffer has enough buffer credit. Buffer credit is low when the buffers are nearly full. In some embodiments, the hybrid controller still has room in the buffer for a specified amount of data and when the buffer credit is low and will still accept a few more NVM operations.

If the buffer credit is low, the hybrid controller generates an interrupt signal 530 (INTR) on the ACK/IRQ line to the host that includes a waveform with two negative pulses to push back or reduce the host $NVM_{write}$ operation speed. This pulse modulation technique can be used to provide more than one interrupt for the same transfer operation. For example, the hybrid controller may toggle the ACK/IRQ line to indicate the data is out of order and to indicate the end of the transfer. When the credit is low signal is decoded by the CPU/SoC host, the CPU/SoC may halt the sending of write data and wait to send more of the write data when the hybrid controller indicates buffer nearly full. However, in some embodiments the hybrid controller may continue to handle additional NVM write commands with 128 Byte data by overwriting the read data in buffers. The overwriting operations may cause the hybrid controller to re-read those overwritten data from NVM/3D-XP die at a later time by scarifying performance of LP4-T read-transactions. This can be useful to keep the LP4-T write-transactions operating smoothly because the NVM/3D-XP die have much better read performance compared to the write performance.

Figure 5B:
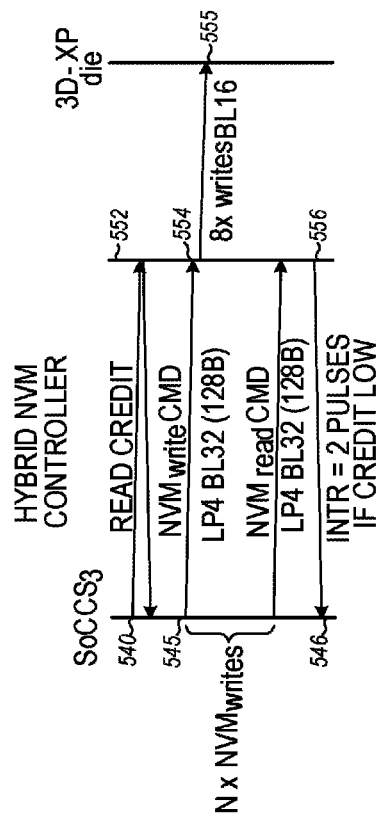
FIG. 5B is a diagram of interaction among a host SoC, hybrid controller for memory, and NVM/3D-XP die during LP4-T write transactions, according to some embodiments.

FIG. 5B is a diagram of interaction among a host SoC, hybrid controller for memory, and NVM/3D-XP die during LP4-T write transactions. At 540, the diagram shows the host SoC asserting $CS_3$ and using a partial DRAM read command $rd_{1,2}$ without a $ACT_{1,2}$ command for a row address to fetch the credit of the hybrid controller's write buffers. At 552, the hybrid controller provides the buffers credit for its buffers to the host SoC. When enough buffer credit is available, the host starts several NVM write-transactions by sending $NVM_{write}$ commands, one-by-one, with 128 B data burst to the hybrid controller. At 554, the hybrid controller generates 8 write BL16 operations to interleave multi-bank/partition writes of 8×16 B=128 Byte to the NVM/3D-XP die. At 555, the XD-XP die writes the 8×16 B of data to the assigned physical memory locations to complete the LP4-T write transaction. The hybrid controller may generate a credit-low interrupt to the host (shown at 556) when there is a credit low event. At 546, the host receives this INTR on the ACK/IRQ line and throttles (e.g., reduces) the LP4-T write transactions pace or rate. In certain embodiments, the hybrid controller may handle overshoot of write transactions to maintain LP4-T write performance by scarifying performance of LP4-T reads.

Figure 5C:
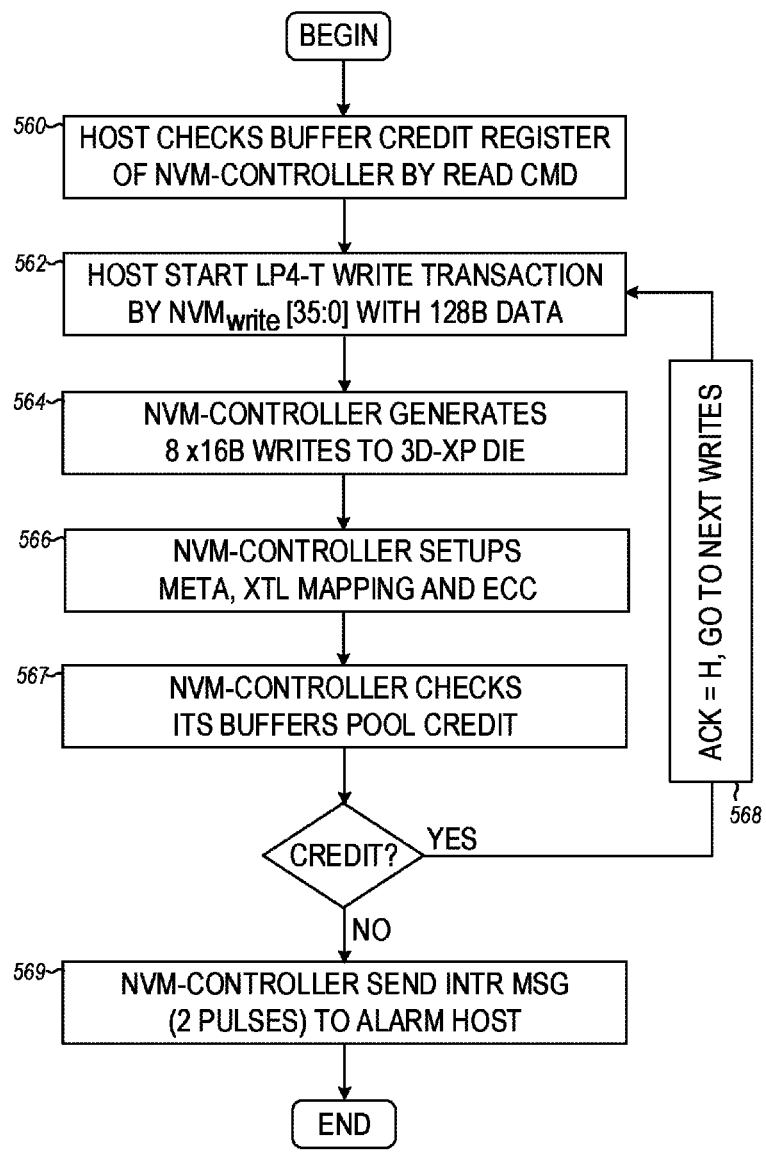
FIG. 5C is a flow diagram of the interaction among a host and hybrid controller for LP4-T write transactions, according to some embodiments.

FIG. 5C is a flow diagram of the interaction among a host (e.g., SoC) and hybrid controller for LP4-T write transactions. The host checks the buffer credit register of the hybrid controller at 560. If there is enough buffer credit, at 562 the host may sequentially start several LP4-T write transactions, one-by-one. At 564, the hybrid controller generates 8 writes BL16 (8×16 B=128 B) operations to the NVM/3D-XP die. At 566, the host sets up metadata and an X-memory Translation Layer (XTL) mapping table and error correction code (ECC). The corresponding transaction completion status register is also updated. At 567, the hybrid controller checks its buffer pool credit. If there is enough buffer credit, at 568 the hybrid controller keeps the signal on the ACK/IRQ line at a High level and returns to 562 to start the next write transactions. If the credit becomes low, at 569 the hybrid controller may send an interrupt signal as two negative pulses to alert the host to slow down the write transaction pace or end the LP4-T write transactions. After each update of the XTL mapping table at 566, the newly written 128 B data burst is ready for read transactions. In certain embodiments, there may also be one or more DRAM caching mechanisms to shorten the data ready latencies of the newly written data that is presented.

Figure 6A:
FIG. 6A is a timing diagram of LP4-T read transactions and interrupt with pulse modulated error messaging, according to some embodiments.
Figure 6B:
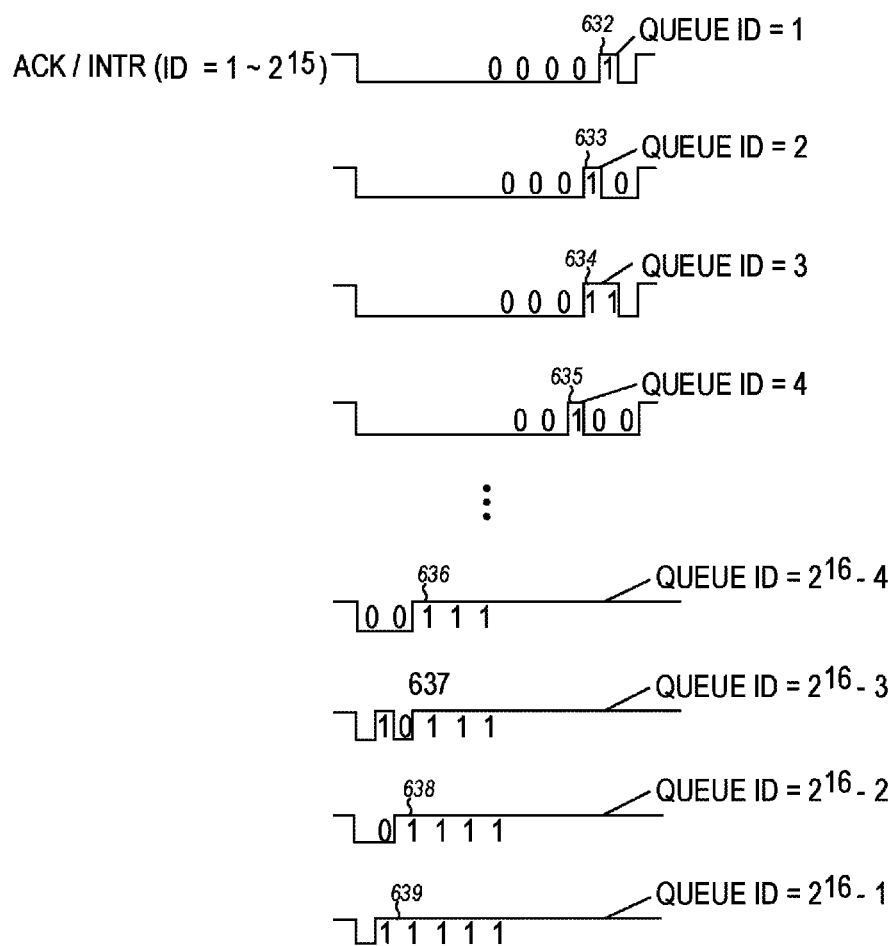
FIG. 6B are examples of timing diagrams for read transactions, according to some embodiments.

FIG. 6A is a timing diagram of LP4-T read transactions to access the NVM/3D-XP die in memory mode. The host (e.g., SoC) sends a NVM read command 612 with 28 bit $NV_{address}$ [27:0] to the hybrid controller thru the C/A control bus. When there is a cache hit on the read operation, the hybrid controller reads the data from DRAM cache and presents (e.g., as a burst) the data 622 on the data bus as a BL32 (32×4 B=128 Byte) read operation and presents the ACK signal at a Low level for 16 clock cycles during the BL32 presentation of data. The host may continue to send additional NVM md commands 614 and 616. When there is a cache miss, the hybrid controller may put the 128 Bytes of data 621 from buffers that hold old LP4-T read transaction result queue data and present an ACK/INTR signal on the ACK/IRQ line that carries the read transaction identifier (id) or an error message 631 (err-msg) during the 16 clock cycles of the BL32 burst on the LP4 data bus. The ACK/INTR signal shares the same feedback line or link with the ACK Level-signaling (ACK=Low) or Pulse-signaling (INTR=id or err-msg). The 16 clock cycles pulses allow for transaction queue id values of 1 to $2^{15}$, or the mixed with err-msg and parity bit. FIG. 6B are examples of timing diagrams 632, 633, 634, 635 for read transactions with queue id=1, 2, 3, 4, respectively. Timing diagrams 636, 637, 638, 639 are examples of read transactions with queue id=$2^{16}-4$, $2^{16}-3$, $2^{16}-2$, and $2^{16}-1$.

Figure 6C:
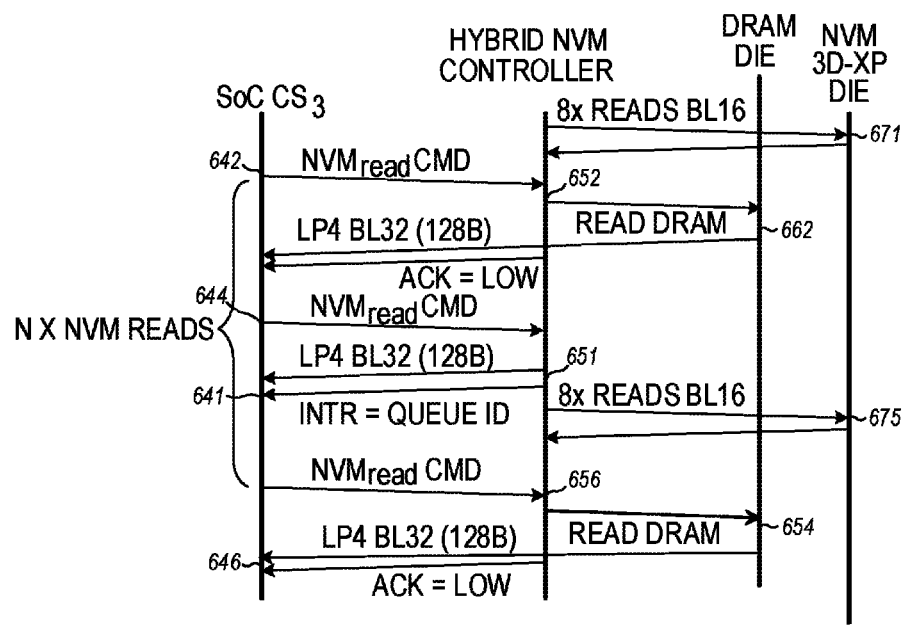
FIG. 6C is a diagram of interaction among a host SoC, hybrid controller, and NVM/3D-XP die for LP4-T read transactions, according to some embodiments.

FIG. 6C is a diagram of interaction among a host SoC, hybrid controller for memory, and NVM/3D-XP die and DRAM die for LP4-T read transactions. At 642, the SoC starts a LP4-T read transaction by asserting $CS_3$ and sending a $NVM_{read}$ command with $NV_{address}$ [27:0] to the hybrid controller. At 652, the hybrid controller checks the cache-management table for a cache-hit. When there is a cache hit, at 662 the hybrid controller reads the associated DRAM cache to get a BL32 burst (128 Byte) data and sends the 128 Bytes of data to the host with ACK=Low signal on the ACK/IRQ line to complete this read transaction. When there is a cache miss, the host may start another read transaction at 644. In response to the cache miss, at 651 the hybrid controller may send a BL32 burst to the host from the hybrid controller buffer pool read queue that holds previous cache-miss read transaction results with the interrupt (INTR) set to the queue identifier (INTR=queue id). Returning to 671, the host receives the 128 B data with queue id to complete the associated old cache-miss read transaction that the NVM/3D-XP die provided the 8×BL16 (128 Byte). At 675, the hybrid controller may send 8 read BL16 commands to the NVM/3D-XP die to obtain the cache-miss data then buffered those 128 Bytes into the hybrid controller buffer pool. At 641, the host and hybrid controller may both update their read transaction queues and completion statuses that the cache-missed time spot was filled or replaced by a previous read transaction result data. When there is a cache hit, the host may continue with another read transaction. At 656, the hybrid controller may read from the DRAM cache, and at 654 respond to the host with a BL32 burst with ACK=Low signal to the host from DRAM cache at 654. The host may obtain the number of data bursts that are ready in the cache-miss read queue in the hybrid controller's buffer pool by using $CS_4$ scheduling pulse control signals and ACK/IRQ=pulse code messages at the previous time slot.

Figure 6D:
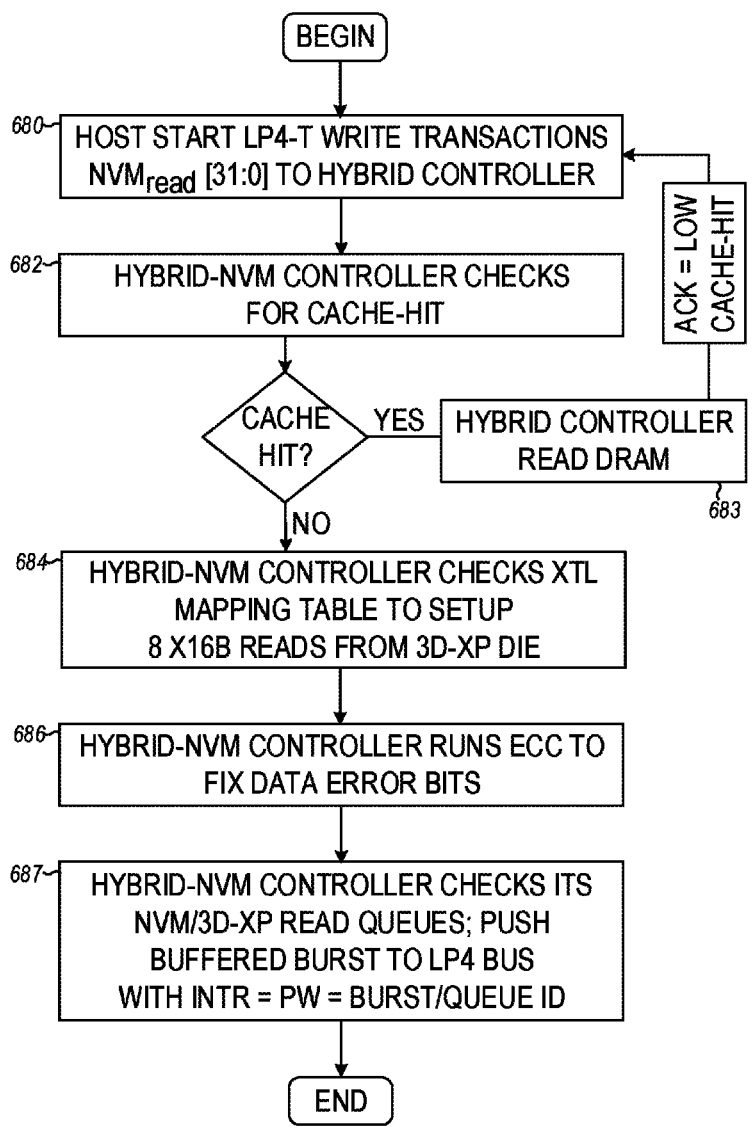
FIG. 6D is a flow diagram of the interaction among a host SoC and hybrid controller for LP4-T read transactions, according to some embodiments.

FIG. 6D is a flow diagram of the interaction among a host SoC and hybrid controller for LP4-T read transactions. At 680, the host starts read transactions by asserting $CS_3$ and sending $NVM_{cmd}$ to the hybrid controller. At 683, the hybrid controller checks its cache-management table for a cache-hit. When there is a cache hit, the hybrid controller may read the DRAM cache, and send the BL32 (128 Byte) date (e.g., as a burst) to the host with the ACK=Low signaling. At 684, the hybrid controller may check the XTL mapping table and then generate 8 BL16 read operations to read data from the NVM/3D-XP die. At 686, the hybrid controller may perform error detection and correction to fix bit errors. At 687, the hybrid controller checks the read queues and may push buffered data in a burst mode to the LP4-T bus with the ACK/IRQ line indicating burst mode and queue id.

Figure 7A:
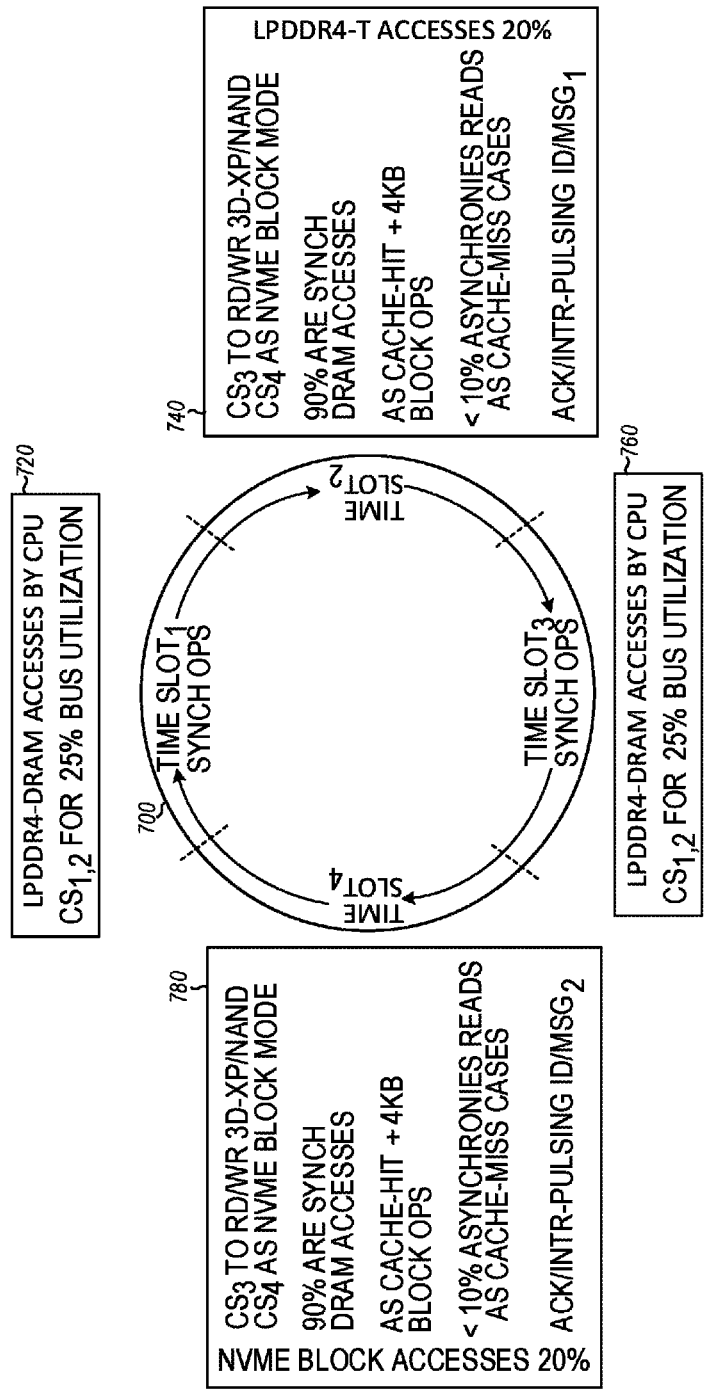
FIG. 7A is an illustration of time scheduling for access to shared DRAM dies by a host SoC and hybrid controller, according to some embodiments.
Figure 7B:
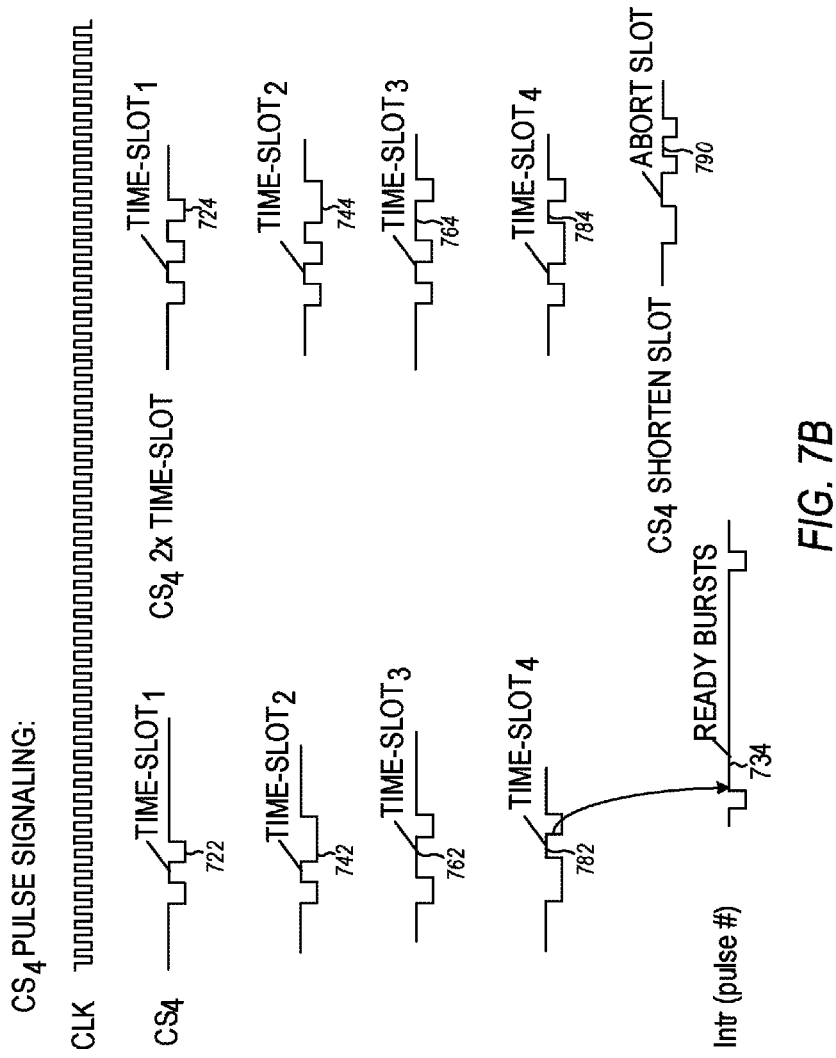
FIG. 7B are timing diagrams for chip select ($CS_4$) control signals to schedule read transactions on the LPDDR4 bus using specified time slots, according to some embodiments.

FIG. 7A is an illustration of time scheduling for access to shared DRAM dies by a host CPU/SoC and a hybrid controller. The scheduling may be implemented by logic circuitry of the hybrid controller. The scheduling provides interleaved access by the host and hybrid controller to the DRAM and NVM. A round robin scheduler 700 consists of four time slots for accessing memory. In time-slot$_1$ 720 or time-slot$_3$ 760, the host may access two DRAM dies (e.g., by asserting $CS_{1\ or\ 2}$) to provide 25% synchronized utilization of the LP4 bus. In time-slot$_2$ 740, the host may access the NVM/3D-XP or NAND dies in NV memory mode for LP4-T nondeterministic transactions for 20% utilization of the LP4 bus. In time-slot$_4$ 780 the host may access the NVM/3D-XP or NAND dies in block storage mode as 780 in the time-slot$_4$ for NVM block read/write transactions for another 20% utilization of the LP4 bus. The NVM block read/write transactions may be performed using 4 kB DMA transfers in the background local to the MCP or PoP. The hybrid controller may access the DRAM diet within time-slots$_{2,3,4}$ and the DRAM die2 within time-slots$_{1,2,4}$. The time-slot duration may be setup to handle 8 DRAM read/write BL32 accesses as 8×16 clock cycles or 106 ns at 2400 MT/s LPDDR4 bus speed. Each particular time slot could be prolonged by 2 times or shortened by the $CS_4$ pulse signaling as needed FIG. 7B are timing diagrams for chip select ($CS_4$) pulse control signals to schedule read transactions on the LPDDR4 (or LP4) bus using a time slots of the scheduler of FIG. 7a. Pulse signal timing on chip select line $CS_4$ can be used to designate the time slots on the LP4 bus. In waveform 722, time-slot$_1$ is indicated using two negative pulses 722 by the host to access the DRAM dies using by $CS_{1\ or\ 2}$ as shown in 720 of FIG. 7a. In waveform 742, time-slot$_2$ is indicated by the host as two negative pulses 742 with a double width second pulse to access the NVM/3D-XP die by $CS_3$ and LP4-T nondeterministic transactions as shown in 740 of FIG. 7a. In waveform 762, time-slot$_3$ is indicated by the host as two negative pulses 762 with double interval between two pulses for access to the DRAM dies as shown in 760 of FIG. 7a. In waveform 782, time-slot$_4$ is indicated by the host as two negative pulses with a double width first pulse. Time-slot$_4$ can be used for hybrid controller to DMA transfers of 4 KB data blocks between the DRAM and NVM/3D-XP dies, and for sending cache-miss read transaction data from the hybrid controller buffers to the host. For the even time slots (time-slot$_{2\ or\ 4}$), the hybrid controller may use the ACK/IRQ line to send the number of ready bursts (1 to $2^{14}$) of cache-miss reads from the NVM/3D-XP die in its buffers to the host.

Waveforms 724, 744, 764, and 784 can be used to double the size of the time slots using $CS_4$ signaling. Waveforms 724 and 744 can be used by the host to schedule a twice as long time slot for time-slot$_1$ or time-slot$_2$, respectively, to access DRAM dies. Waveform 764 may be used by the host to double the size of time-slot$_3$ to access NVM/3D-XP die. Waveform 784 may be used to double the size of time-slot$_4$ for hybrid controller to DMA transfer 4 KB blocks and delivery of cache-miss read 128 B bursts to the host. The host could also shorten any time slot by sending pulse waveform 790 to abort the time slot operation. A time slot may be aborted if the host DRAM read/write command queue or the LP4-T command queue is close to empty. When the abort waveform is received by the hybrid controller, the hybrid controller may immediately place a cache-miss read result on the bus from its transaction buffers if there are previous cache-miss read bursts ready. This is useful to fill any gaps between even and odd time-slots to improve bus utilization.

Figure 8A:
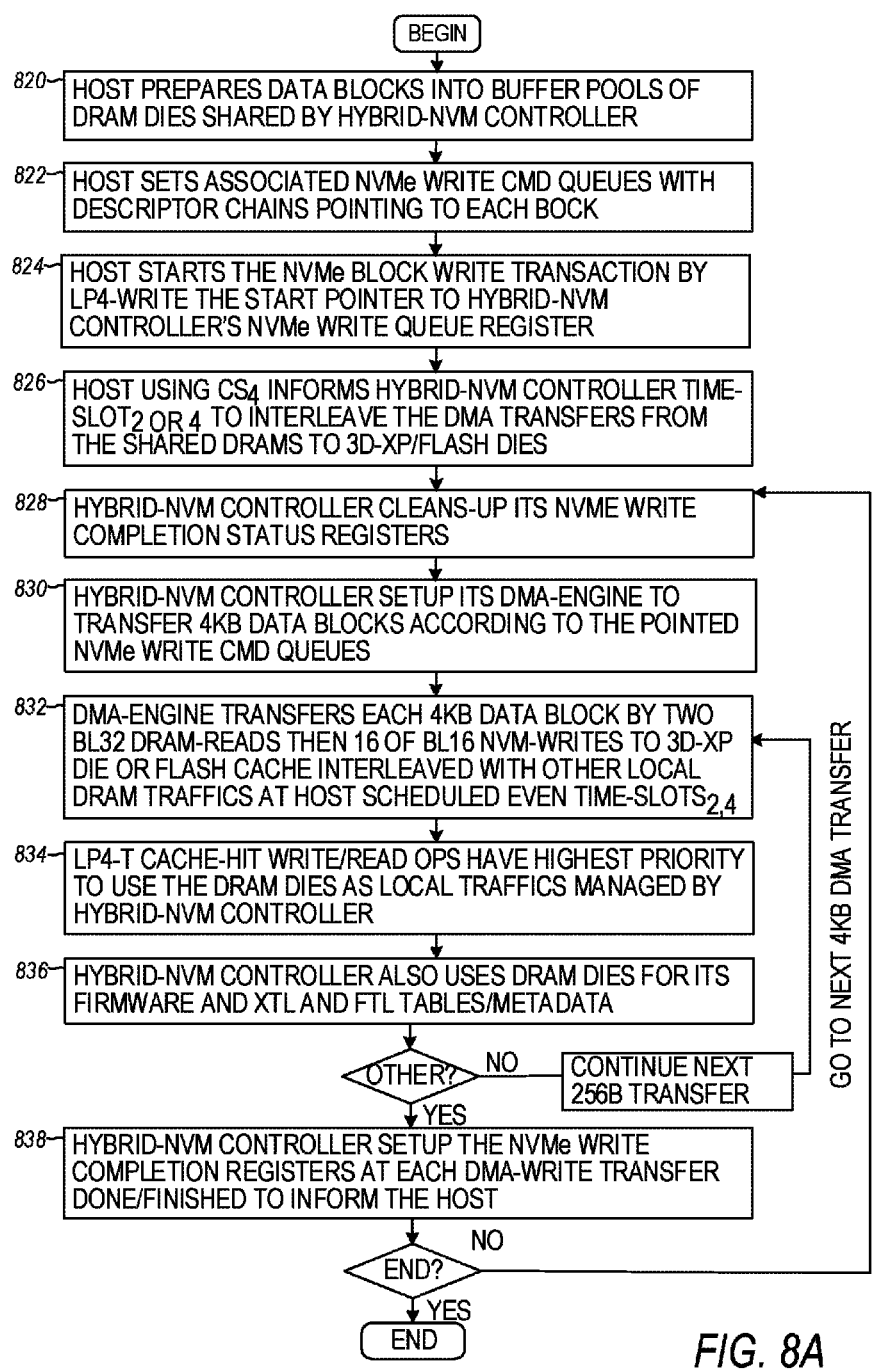
FIG. 8A is flow diagram of block write transactions from the hybrid controller, according to some embodiments.

FIG. 8A is flow diagram of an embodiment of block write transactions from the hybrid controller for NVM express (NVMe) and drive support. At 820, the host (e.g., SoC) prepares the application data blocks into the pool of buffers in the DRAM dies that are also shared by the hybrid controller. At 822, the host continues to build associated NVMe write command queues with descriptor chains pointing to each data block in the buffer pool. At 824, the host may start the NVMe block write transactions using an LP4-T write to the starting pointer of the NVMe write command queue register of the hybrid controller. At 826, the host may use $CS_4$ schedule signaling to inform the hybrid controller to use a time slot (e.g., time-slot$_{2\ or\ 4}$ of FIG. 7A) when the host is not using the DRAM dies for interleaving DMA transfers of 4 KB data blocks from the buffer pool to the NVM/3D-XP die. At 828, the hybrid controller may clean-up the NVMe write completion status registers. At 830, the hybrid controller sets up a DMA-engine to transfer each of the 4 KB data blocks in the DRAM buffer pool to the NVMe command queue pointed to by the starting pointer. At 832, the hybrid controller begins the DMA transfer of each 4 KB block. The DMA transfers may use two reads BL32 (2×32×4 B=256 B) from the source buffer in DRAM die followed by 16 writes BL16 (16×16 B) to the 3D-XP die or cache in flash dies interleaved with other local DRAM traffic at the host scheduled even time slot (time-slot$_2$ or time-slot$_4$). At 834, the LP4-T write/read cache-hit operations are assigned the highest priority to use the DRAM dies at the even time-slots. At 836, the hybrid controller may also use DRAM dies for storing firmware and XTL/FTL/metadata. Flow returns to 832 to complete the other 256 B transfers for the 4 KB block write operation. At 838, the hybrid controller sets up the associated NVMe write completion registers after each 4 KB DMA write transfer completes to inform the host. Flow returns to 830 and the process continues until the NVMe write command queue is empty.

In the embodiment of FIG. 8A, tasks 820 and 822 may be completed within time-slot$_1$ or time-slot$_3$ for the host to directly access the two DRAM dies. Tasks 830 and 832 may be completed within time-slot$_2$ or time-slot$_4$ for the hybrid controller DMA to transfer 4 KB blocks from the two DRAM dies to 3D-XP die in the background. At 834, the hybrid controller uses the LP4 bus to deliver cache-miss read bursts or LP4-T write transactions when the host is not using the DRAM dies. Task 836 is performed local to the MCP or PoP by the hybrid controller using DRAM dies.

Figure 8B:
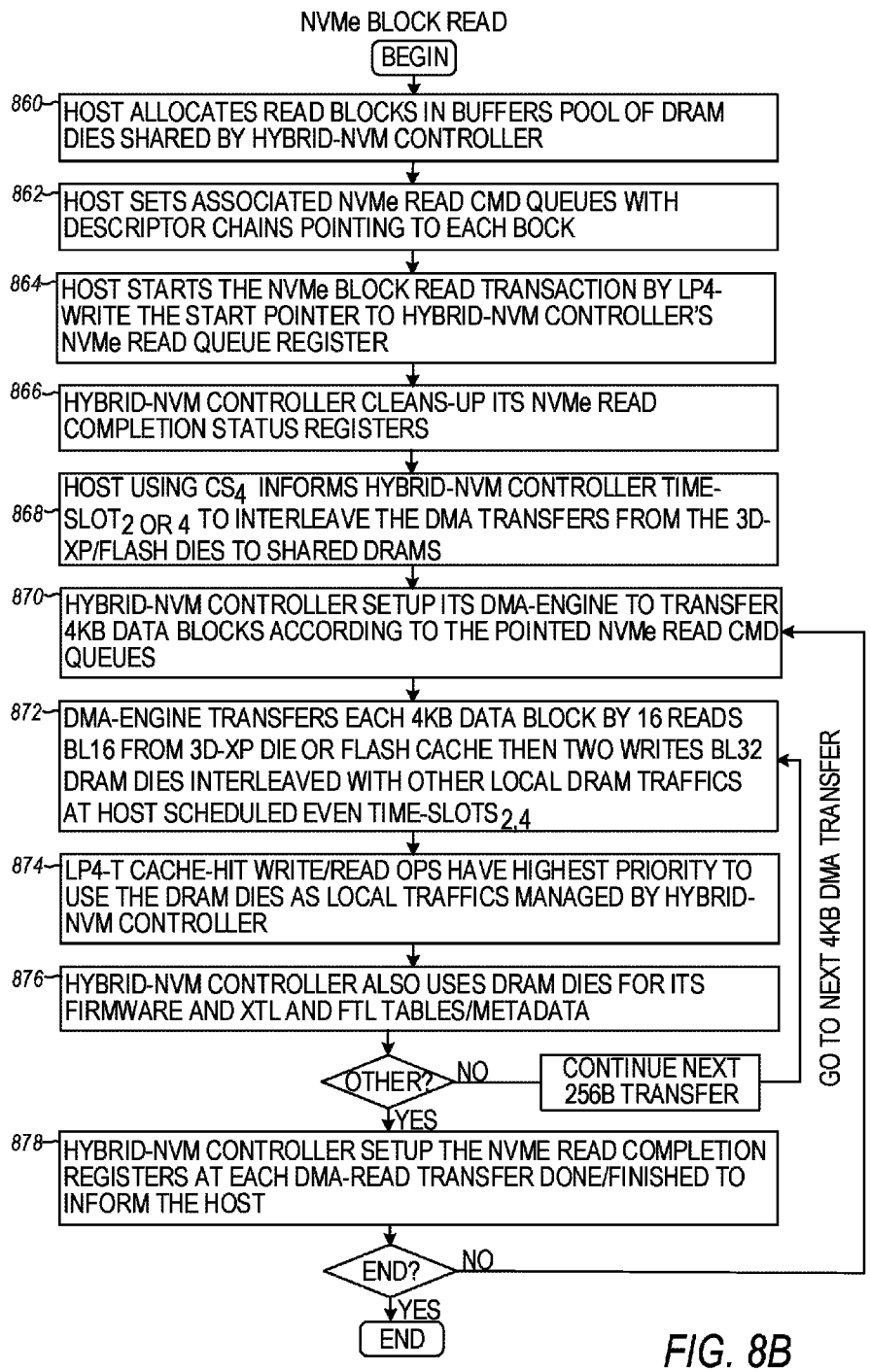
FIG. 8B is flow diagram of block read transactions from the hybrid controller, according to some embodiments.

FIG. 8B is flow diagram of an embodiment of block read transactions from the hybrid controller. At 860, the host allocates the read data blocks in the buffer pool of the DRAM dies. At 862, the host continues to build the associated NVMe read command queues with descriptor chains pointing to each allocated data block in the buffer pool. At 864, the host may start the NVMe block read transactions using an LP4-T write to the starting pointer of the NVMe write command queue register of the hybrid controller. At 866, the host may use $CS_4$ schedule pulse signaling to inform the hybrid controller when the DRAM dies are available for DMA transfers of 4 KB data blocks from the NVM/3D-XP die to the allocated buffers. At 868, the hybrid controller may clean-up the NVMe read completion status registers. At 870, the hybrid controller sets up the DMA-engine to transfer each 4 KB data block to the NVMe read command queue pointed to by the starting pointer. At 872, the hybrid controller starts DMA transferring each 4 KB block by 16–BL16 (16×16 B) reads from the NVM/3D-XP die or cache in Flash dies. The hybrid controller may then interleave two BL32 (256 B) writes to the destination buffer in DRAM die interleaved with other local DRAM traffic at the host scheduled time slot (e.g., time-slot$_2$ or time-slot$_4$ in FIG. 7A). At 874, the LP4-T write/read cache-hit operations are assigned the highest priority to use the DRAM dies at the even time-slots. The hybrid controller may also use the DRAM dies for storing firmware and XTL/FTL/metadata. Flow returns to 832 to complete the other 256 B transfers to finish the 4 KB block read operations. At 878, the hybrid controller sets up the associated NVMe read completion registers to inform the host after each 4 KB DMA read transfer completes. Flow returns to 830 and the process continues until the NVMe read command queues are empty.

In the embodiment of FIG. 8B, tasks 860 and 862 may be completed within time-slot$_1$ or time-slot$_3$ for the host directly accessing the two DRAM dies. Tasks 870 and 872 may be completed within time-slot$_2$ or timeslot$_4$ for the hybrid controller DMA to transfer 4 KB blocks from 3D-XP die to DRAM dies in the background. At 874, the hybrid controller uses the LP4 bus to delivery cache-hit read 128 B bursts from two DRAM dies, to deliver previous cache-miss read 128 B bursts from its buffers, or to deliver cache-hit write 128 B bursts to DRAM dies. Task 876 is performed local to the MCP or PoP by the hybrid controller using DRAM dies.

Figure 9A:
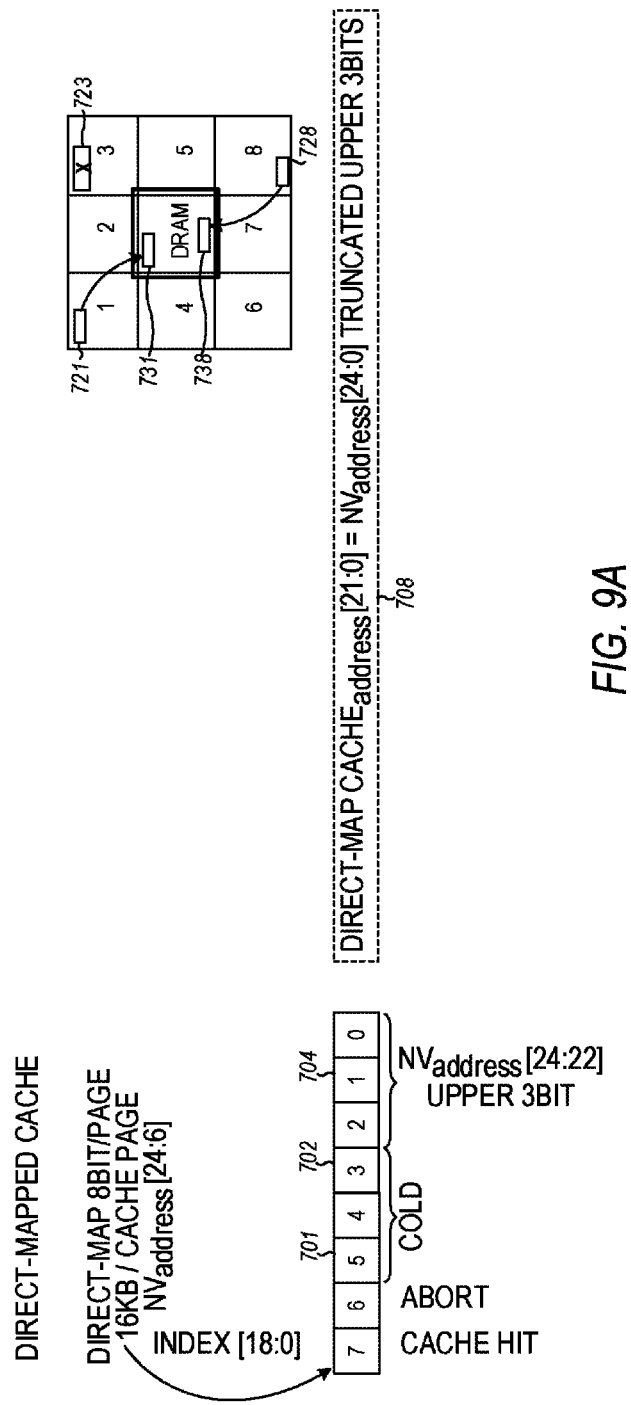
FIG. 9A is an illustration of an embodiment of a direct-mapped cache mechanism used by the hybrid controller, in accordance with various embodiments.

FIG. 9A is an illustration of an embodiment of a direct-mapped cache mechanism used by the hybrid controller. The hybrid controller caches an eight giga-byte (8 GB) NVM/3D-XP die using 2×512 MB DRAM dies. The 8 GB NVM space could be organized as multiple 512K×16 KB cache pages (one of a quarter of a 64 KB memory segment) using a 512K×8 bit cache table. The lower order 7 bits of the LP4-T write $NV_{address}$ [25:0] could be truncated to form an index [18:0] into 512K cache table entries (of 16 KB per entry) within the hybrid controller's 512 KB static random access memory (SRAM). A shown in FIG. 9A, bit [7] 701 of the truncated bits may be used in the cache table to indicate a "cache-hit." Bit [6] 702 may be used to signal aborting a flush of the cache pages. Bits [5:3] 704 may be used to indicate a cache page being "hot" or "cold" according to measurements of the frequency of access to the page. Bits [2:0] may be used to indicate which of the 8 pages was used by the cache on the cache-hit. FIG. 9A shows incoming write 721 of 128 B at the first 1 GB of NVM/3D-XP cached as 731 in DRAM space with the first 4 bits 701 marked as [1000] if it is a new cache-hit, as a free page mark [0000] if it is a free page, or marked as [1000] if it is a repeat cache-hit. FIG. 9A also shows another incoming write 723 of 128 B that is a cache-miss because the same 16 KB DRAM page is already occupied by incoming write operation 721. For a cache-miss, the 128 B of incoming write 723 are buffered by the hybrid controller for an LP4-T write transaction (e.g., 564 in FIG. 5c). Another incoming write 728 is shown as a cache-hit. The first 4 bits 701 may be marked as [1111] from free page [0111]. The hybrid controller may write this 128 B burst directly into DRAM cache using a BL32 write 738 based on DRAM address 708. Bank[2:0] Row[15:0] of the DRAM may be accessed using $NVM_{address}$ [21:3] by truncating bits [2:0] of $NVM_{address}$ [21:0], and DRAM address Col [9:1]=$NVM_{address}$ [2:0], [000000] as 32×4 B write operations.

Figure 9B:
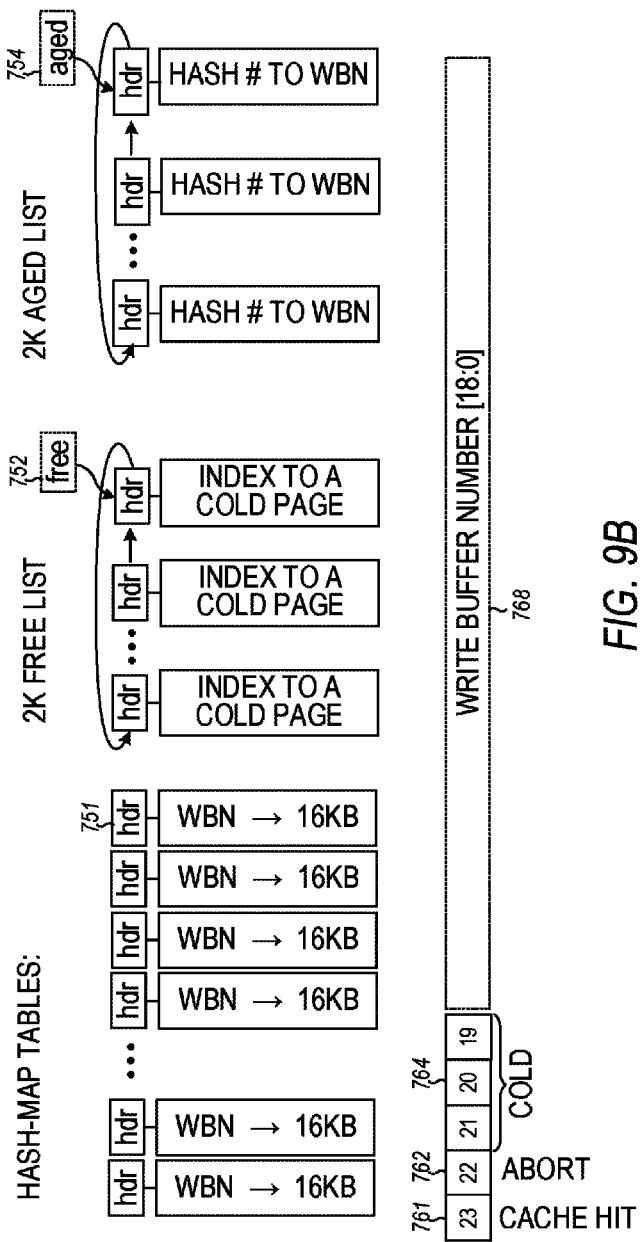
FIG. 9B is an illustration of embodiments of hash mapped cache-tables, a free page list, and an aged page list, in accordance with various embodiments.

FIG. 9B is an illustration of embodiments of hash mapped cache-tables, a free page list, and an aged page list. The hash-mapped cache mechanism may reduce the size of the hybrid controller's cache-tables and may provide 100% cache hits for write operations by using an ingress buffer. An ingress buffer buffers all incoming data packages received over the network links. The MCP or PoP may include a network processor to process the ingress pages in the buffer. The network processor releases the aged pages in the ingress buffers as free pages to make room for new incoming packages in the ingression buffer. The direct-mapped cache mechanism described previously uses 512 kB for a cache table with 3 Bytes per entry. However, less than ⅛ of the cache table entries may be used for cache hits. The cache response time may be improved by reducing the size of the cache table because the DRAM address can be build or derived from the NVM address when the write operation results in a cache hit. In some embodiments, the cache table is reduced to 64 kB×3 B=192 kB. The hash-mapped mechanism covers 64 kB cache hit cases and eliminates the other ⅞ of the 512 k direct-mapped cache table by hashing the 19 bit NVM address into a 16 bit index. The 16 bit index points to table entry saved by a 19 bit Write Buffer Number (WBN) to derive the DRAM address.

In some embodiments, the hash-mapped cache approach includes hash-mapped cache tables of an ingress page index 751, a 2K free page list 752, and a 2K aged page list 754. A particular hash-mapped cache table entry of index 751 consists of 24 bits [23:0]. Bit 23 can be used to indicate a cache-hit 761, bit 22 can be used to indicate abort the cache-flush DMA transfer of a 16 KB page, and bits 21 through 19 [21:19] can be used for cold measurements of cache read traffic. Bits 18:0 can be used as a 19 bit Write Buffer Number (WBN) for generating a DRAM address, Bank[2:0] Row[15:0]=WBN [18:0], and DRAM address Col [9:1]=$NVM_{address}$ [2:0], [000000]. The free page list 752 can quickly provide a DRAM address to buffer write data incoming on the LPDDR4 bus. A unique index can be hashed out to save the incoming NVM address (e.g., by saving only the upper 19 bits as the 16 kB page address). There can be cache hits for 100% of write operations as long as cold aged pages can be transferred by DMA into the NVM/3D-XP die to release more pages in time for the new write operations. For LP4-T read operations, the NVM address the same unique address can be hashed out to obtain the 19 bit cached-page address in the DRAM dies that was saved in the hash-mapped cache tables.

Figure 10A:
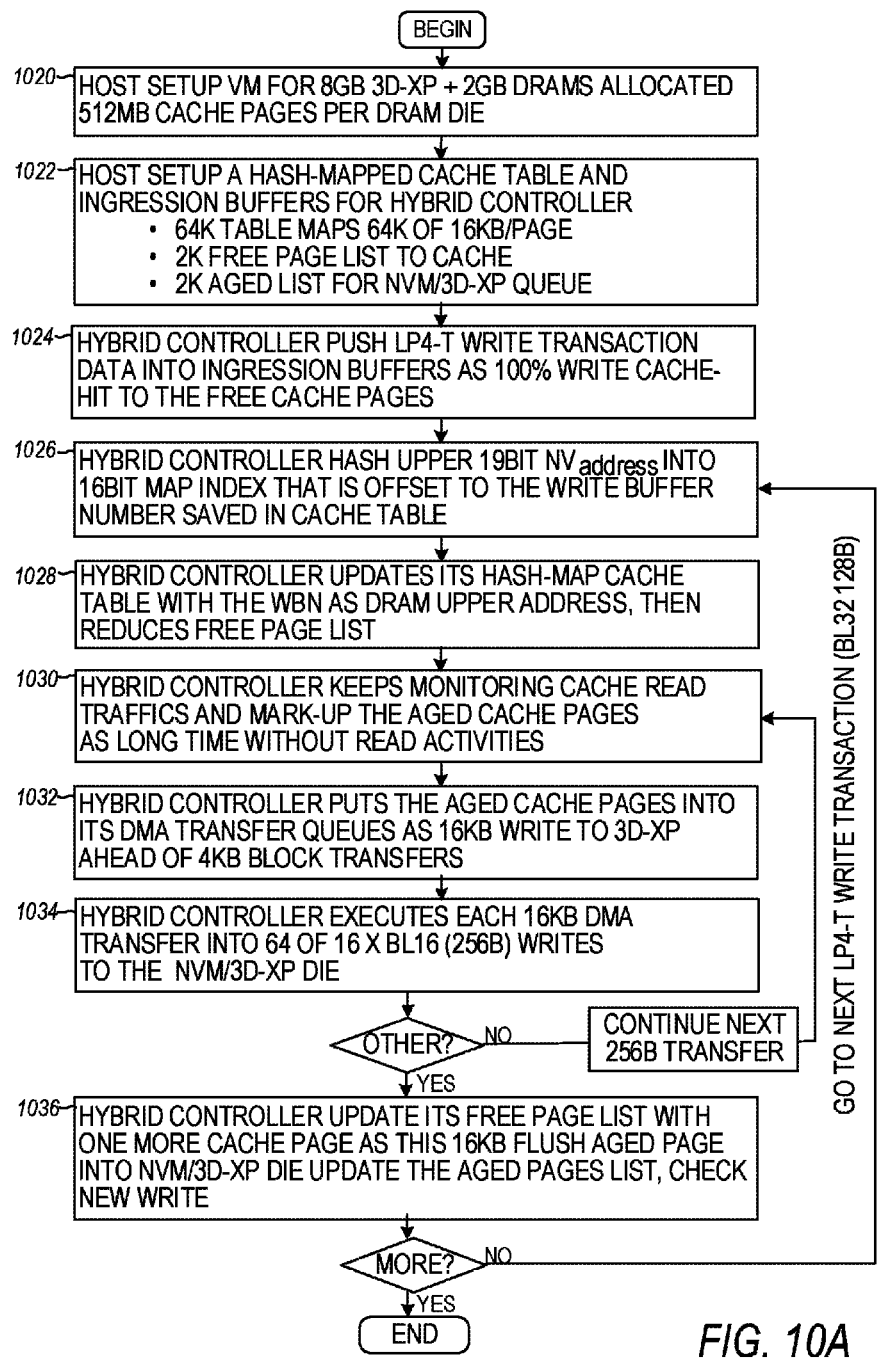
FIG. 10A is a flow diagram for a hash-mapped cache mechanism for cache writes, according to some embodiments.

FIG. 10A is a flow diagram for a hash-mapped cache mechanism for cache writes. The hash-mapped cache mechanism can boost performance of the NVM/3D-XP using 100% cache-hit write operations. At 1020, the host sets up a Virtual Memory (VM) mapping for the 8 GB NVM/3D-XP and the 2 GB DRAM space. At 1022, the host sets up hash-mapped cache tables of 64K×16 KB pages for the hybrid controller, a 2K free page list for more ingressions, and a 2K aged list. For the aged page list, the DMA writes the 16 KB aged pages pointed to in the list to the NVM/3D-XP die, and releases more free pages when the aged pages are written. At 1024, the hybrid controller may push LP4-T write transaction bursts (e.g., 128 B bursts) into the ingress buffers in the DRAM dies as 100% cache-hit writes to the free cache pages indicated in the free age list. At 1026, the hybrid controller hashes the upper 19 bits of the $NVM_{address}$ [25:6] into a 16 bit index [15:0] pointed to by the hash-mapped cache tables (64K entries). Each index holds the WBN (upper 19 bit DRAM address). At 1028, as a result of the cache writes the hybrid controller updates the hash-mapped cache table's status bits and then reduces the free page list. At 1030, the hybrid controller continues to monitor cache read traffic and updates the aged pages list with those pages that have not had read activity for a long time. At 1032, the hybrid controller places the aged cache pages into its DMA transfer queues. The aged pages may be transferred as 16 KB writes to the NVM/3D-XP ahead of any 4 KB block DMA transfers between DRAM and the NVM (cache operations have highest priority than block storage traffic). At 1034, the hybrid controller executes each 16 KB DMA transfer into 64-16–BL16 writes (256 B bursts) to the NVM/3D-XP die. The transfers continue at 1034 while there are more 256 B to transfer, otherwise, the hybrid control proceeds to 1036 and updates the free page list with more cache pages and reduces the aged page list when those 16 KB pages are flushed into the NVM/3D-XP die. The hybrid controller then loops back to 1024 to handle more LP4-T write transactions.

Figure 10B:
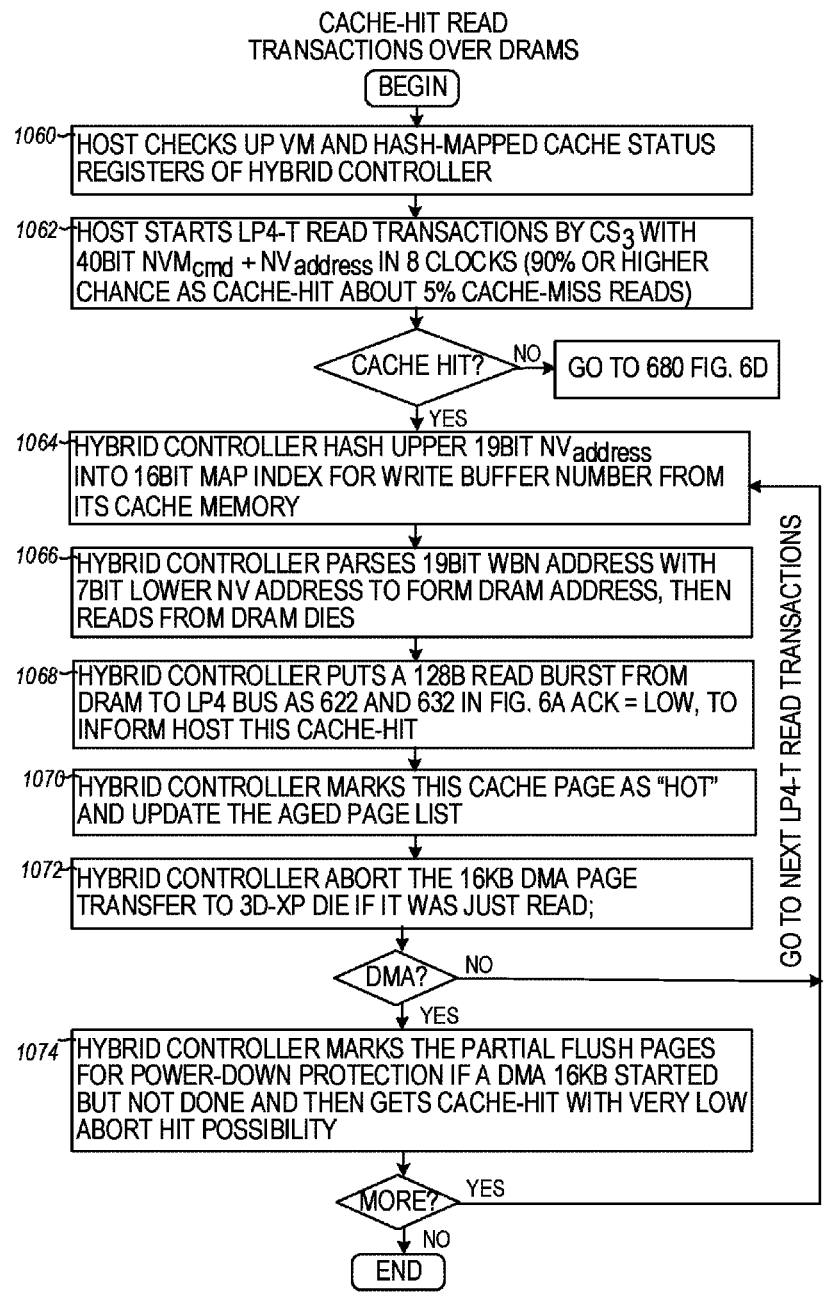
FIG. 10B is a flow diagram for cache-hit read transactions of the DRAM dies, according to some embodiments.

FIG. 10B is a flow diagram for cache-hit read transactions of the DRAM dies. At 1060, the host checks the VM and hash-mapped cache status registers of the hybrid controller. At 1062, the hybrid controller starts LP4-T read transactions by asserting $CS_3$ and sending a 40 bit $NVM_{cmd}$ and $NVM_{address}$ in 8 clock cycles. The LP4-T read transactions may have a 90% or higher cache-hit rate and about 5% cache-miss rate. At 1064, the hybrid controller hashes the upper 19 bit of $NVM_{address}$[24:5] into the 16 bit index to obtain the WBN pointer to the DRAM cache page. If there is a cache miss, flow branches to 680 in FIG. 6c. If there is a cache-hit on the read, at 1066 the hybrid controller parses out the corresponding DRAM address Bank[2:0] Row[15:0]=WBN [18:0] and DRAM address Col [9:1]=$NV_{address}$ [2:0], [000000] for a 32×4 B DRAM read operation. At 1068, the hybrid controller places a 128 B burst of data read from DRAM onto the LP4 bus (as shown at 622 and 632 in FIG. 6a), with ACK=Low to inform the host this is a cache-hit burst data. At 1070, the hybrid controller marks the just read cache page as "hot" and removes it from the aged page list. At 1072, the hybrid controller aborts the 16 KB DMA transfer writes to the corresponding page in the NVM/3D-XP die if the cache page was being flushed when it was read by the host. If the cache page read was not undergoing a flush operation, the hybrid controller returns to 1064 for the next LP4-T read. If the cache page was partially flushed by the DMA 16 KB transfer when it was aborted, the hybrid controller may mark the abort bit in the associated cache table for the partially flushed cache page as abort bit=1 for future power-down memory protection operations.

The embodiments described provide for memory access to the MCP at DRAM performance for most operations, even though the MCP includes NVM. Memory management functions are offloaded from a CPU or SoC to a hybrid controller for memory included in the MCP. This allows for applications that use a lot of memory to be run on smaller device such as smart phones and tablet computers.

ADDITIONAL DESCRIPTION AND EXAMPLES

Example 1 includes subject matter (such as an apparatus) comprising a hybrid-memory package including: a non-volatile memory (NVM) in an NVM die; a dynamic random access memory (DRAM) in two or more DRAM die, wherein a portion of the DRAM is allocated as a cache memory for the NVM; and a hybrid controller for the NVM and DRAM including: an NVM interface to the NVM; a DRAM interface to the cache memory; a host interface to communicate data with a host processor, wherein the host interface includes a parallel data bus for reading and writing data directly with both of the DRAM and the NVM; and logic circuitry configured to interleave access by the host processor and hybrid controller to the DRAM and NVM.

In Example 2, the subject matter of Example 1 optionally includes a host interface including a NVM chip select line and a command address control bus, wherein the hybrid controller is configured to perform an NVM control command or perform a read or write access to the NVM according to a DRAM activate (ACT) operation received via the command address control bus when the NVM chip select line is activated.

In Example 3, the subject matter of Example 2 optionally includes a hybrid controller configured to perform multiple read partition commands consecutively as a burst read operation or multiple write partition commands as a burst write operation.

In Example 4, the subject matter of one or any combination of Examples 1-3 optionally includes a host interface including a DMA chip select line activated by the processor when the parallel data bus is available, wherein the hybrid controller is configured to, in response to activation of the DMA chip select line, perform DMA cache data transfers including one or more of a DRAM preload, an update of one or more pages of NVM, and a read or write of cache metadata.

In Example 5, the subject matter of one or any combination of Examples 1-4 optionally includes a host interface of the hybrid controller including an acknowledge/interrupt (ACK/IRQ) line and a hybrid controller configured to communicate status of an NVM transfer operation to the host processor using pulse modulation of a signal on the ACK/IRQ line.

In Example 6, the subject matter of Example 5 optionally includes a hybrid controller configured to apply a signal level on the ACK/IRQ line to indicate an acknowledge to the host processor that read data from the NVM is ready, and to apply a pulse modulated signal on the ACK/IRQ line to provide read transaction identifier information.

In Example 7, the subject matter of one or both of Examples 5 and 6 optionally includes a hybrid controller configured to append one or both of data identification information and error status information to read data on the parallel data bus and to apply a pulsed signal on the ACK/IRQ line aligned in time with the appended one or both of data identification information and error status information.

In Example 8, the subject matter of one or any combination of Examples 5-7 optionally includes a hybrid controller configured to apply a pulse modulated signal on the ACK/IRQ line to interrupt the processor when a buffer for read or write data is nearly full.

In Example 9, the subject matter of one or any combination of Examples 1-8 optionally includes a cache memory including multiple cache memory pages, wherein the cache controller is configured to address a cache memory page by truncating a specified number of higher order address bits of the NVM memory received via the host interface.

In Example 10, the subject matter of one or any combination of Examples 1-9 optionally includes a host interface including multiple chip select lines, wherein a chip select line indicates the source or destination of data transferred via the parallel data as either the DRAM, the cache memory, or the NVM.

In Example 11, the subject matter of one or any combination of Examples 1-10 optionally includes a first portion of the DRAM allocated for the cache memory, and a second portion of the DRAM allocated for instructions of a kernel application.

In Example 12, the subject matter of one or any combination of Examples 1-11 optionally includes a hybrid controller configured to perform direct memory access transfers of data between the cache memory and the NVM.

Example 13 includes subject matter (such as an apparatus), or can optionally be combined with one or any combination of Examples 1-12 top include such subject matter, comprising: a hybrid-memory package including: a non-volatile memory (NVM) including an NVM die; a dynamic random access memory (DRAM) including two or more DRAM die, wherein a portion of the DRAM is configured as a cache memory for the NVM; and a hybrid controller for the NVM and DRAM, wherein the hybrid controller includes: an NVM interface to the NVM; a DRAM interface to the cache memory; and a host interface to communicate data with a host processor, wherein the host interface includes a parallel data bus and a serializer/deserializer (SerDes) cache coherence (CC) link; wherein the hybrid controller is configured to receive data from the host device via the SerDes CC link and transfer the data directly to the NVM in the event of cache miss as a background operation to transfers involving the DRAM.

In Example 14, the subject matter of Example 13 optionally includes a host interface including multiple chip select lines, wherein a portion of the chip select lines indicate the source or destination of data transferred via the parallel data bus as the DRAM cache memory or the NVM, and one chip select line of the multiple chip select lines indicates the parallel bus is available for a DMA transfer by the hybrid controller.

In Example 15, the subject matter of one or both of Examples 13 and 14 optionally includes cache memory including multiple cache memory pages, wherein the hybrid controller is configured to address a cache memory page by truncating a specified number of higher order address bits of the NVM memory received via the host interface.

In Example 16, the subject matter of one or any combination of Examples 13-15 optionally includes a first portion of the DRAM allocated for the cache memory, and a second portion of the DRAM allocated for instructions of a kernel application.

Example 17 includes subject matter (such as an apparatus), or can optionally be combined with one or any combination of Examples 1-16 to include such subject matter, comprising: a host device including: a processor, and a host interface to communicate data with a hybrid controller for memory of a separate device, wherein the host interface includes a parallel data bus for data transfers directly to both cache memory and non-volatile memory (NVM), and includes an acknowledge/interrupt (ACK/IRQ) line to receive status from the hybrid controller of the separate device.

In Example 18, the subject matter of Example 17 optionally includes a processor configured to decode a signal level on the ACK/IRQ line that indicates an acknowledge that read data from the NVM is ready to be fetched by the processor, and to decode a pulse modulated signal on the ACK/IRQ line that indicates the read data is out of order.

In Example 19, the subject matter of one or both of Examples 17 and 18 optionally includes a processor configured to: decode a pulse modulated signal on the ACK/IRQ line that indicates that the read data sent from the NVM is out of order; and decode read data order information received with the read data.

In Example 20, the subject matter of one or any combination of Examples 17-19 optionally includes a processor configured to: send write data to the NVM via the parallel bus; decode a signal level on the ACK/IRQ line that indicates an acknowledge to the transfer of write data to the NVM; decode a pulse modulated signal on the ACK/IRQ line that indicates a write buffer is nearly full; and halt write transfers to the NVM in response to decoding the pulse modulated signal.

In Example 21, the subject matter of one or any combination of Examples 17-20 optionally includes a processor configured to trigger storage of one or both of data identification information and error status information according to a pulsed signal on the ACK/IRQ line, wherein the one or both of data identification information and error status information is appended to read data on the parallel data bus.

In Example 22, the subject matter of one or any combination of Examples 17-21 optionally includes the host device being included in a system on chip (SoC) electronic package, and the cache memory and NVM are included in a separate hybrid-memory multi-chip package (MCP).

Example 23 can include, or can optionally be combined with any portion or combination of any portions of any one or more of Examples 1-22 to include, subject matter that can include means for performing any one or more of the functions of Examples 1-22, or a machine-readable medium including instructions that, when performed by a machine, cause the machine to perform any one or more of the functions of Examples 1-22.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Method examples described herein can be machine or computer-implemented at least in part. Some examples can include a computer-readable storage medium or machine-readable storage medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. The code can be tangibly stored on one or more volatile, non-transitory, or non-volatile tangible computer-readable media, such as during execution or at other times. Examples of these tangible computer-readable storage media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment. Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

What is claimed is:

1. An apparatus comprising:
a hybrid-memory package including:
a non-volatile memory (NVM);
a dynamic random access memory (DRAM), wherein a portion of the DRAM is allocated as a cache memory for the NVM; and
a hybrid controller for the NVM and DRAM including:
an NVM interface to the NVM;
a DRAM interface to the cache memory;
a host interface to communicate data with a host processor, wherein the host interface includes a parallel data bus for reading and writing data directly with both of the DRAM and the NVM, and includes a DMA chip select line activated by the processor when the parallel data bus is available, wherein the hybrid controller is configured to, in response to activation of the DMA chip select line, perform DMA cache data transfers including one or more of a DRAM preload, an update of one or more pages of NVM, and a read or write of cache metadata; and
logic circuitry configured to interleave access by the host processor and hybrid controller to the DRAM and NVM.

2. The apparatus of claim 1, wherein the host interface includes a NVM chip select line and a command address control bus, wherein the hybrid controller is configured to perform an NVM control command or perform a read or write access to the NVM according to a DRAM activate (ACT) operation received via the command address control bus when the NVM chip select line is activated.

3. The apparatus of claim 2, wherein the hybrid controller is configured to perform multiple read partition commands consecutively as a burst read operation or multiple write partition commands as a burst write operation.

4. An apparatus comprising:
a hybrid-memory package including:
a non-volatile memory (NVM);
a dynamic random access memory (DRAM), wherein a portion of the DRAM is allocated as a cache memory for the NVM; and
a hybrid controller for the NVM and DRAM including:
an NVM interface to the NVM;
a DRAM interface to the cache memory;
a host interface to communicate data with a host processor, wherein the host interface includes a parallel data bus for reading and writing data directly with both of the DRAM and the NVM, wherein the host interface of the hybrid controller includes an acknowledge/interrupt (ACK/IRQ) line and the hybrid controller is configured to communicate status of an NVM transfer operation to the host processor using pulse modulation of a signal on the ACK/IRQ liner; and
logic circuitry configured to interleave access by the host processor and hybrid controller to the DRAM and NVM.

5. The apparatus of claim 4, wherein the hybrid controller is configured to apply a signal level on the ACK/IRQ line to indicate an acknowledge to the host processor that read data from the NVM is ready, and to apply a pulse modulated signal on the ACK/IRQ line to provide read transaction identifier information.

6. The apparatus of claim 4, wherein the hybrid controller is configured to append one or both of data identification information and error status information to read data on the parallel data bus and to apply a pulsed signal on the ACK/IRQ line aligned in time with the appended one or both of data identification information and error status information.

7. The apparatus of claim 4, wherein the hybrid controller is configured to apply a pulse modulated signal on the ACK/IRQ line to interrupt the processor when a buffer for read or write data is nearly full.

8. An apparatus comprising:
a hybrid-memory package including:
a non-volatile memory (NVM);
a dynamic random access memory (DRAM, wherein a portion of the DRAM is allocated as a cache memory for the NVM, wherein the cache memory includes multiple cache memory pages; and
a hybrid controller for the NVM and DRAM including:
an NVM interface to the NVM;
a DRAM interface to the cache memory;
a host interface to communicate data with a host processor, wherein the host interface includes a parallel data bus for reading and writing data directly with both of the DRAM and the NVM; and
logic circuitry configured to interleave access by the host processor and hybrid controller to the DRAM and NVM, wherein the hybrid controller is configured to address a cache memory page by truncating a specified number of higher order address bits of the NVM memory received via the host interface.

9. The apparatus of claim 8, wherein the host interface includes multiple chip select lines, wherein a chip select line indicates the source or destination of data transferred via the parallel data as either the DRAM, the cache memory, or the NVM.

10. The apparatus of claim 8, wherein a first portion of the DRAM is allocated for the cache memory, and a second portion of the DRAM is allocated for instructions of a kernel application.

11. The apparatus of claim 8, wherein the hybrid controller is configured to perform direct memory access transfers of data between the cache memory and the NVM.

* * * * *

UNITED STATES PATENT AND TRADEMARK OFFICE
CERTIFICATE OF CORRECTION

PATENT NO. : 9,940,980 B2
APPLICATION NO. : 15/199802
DATED : April 10, 2018
INVENTOR(S) : Lee et al.

It is certified that error appears in the above-identified patent and that said Letters Patent is hereby corrected as shown below:

In the Drawings

Sheet 2 of 18, Fig. 2A, reference numeral 224, delete "224" and insert --220-- therefor Sheet 18 of 18, Fig. 10B, reference numeral 1066, Line 2, delete "NV ADDRESS" and insert --$NV_{ADDRESS}$-- therefor In the Specification In Column 1, Line 60, delete "nondeterministic" and insert --non-deterministic-- therefor In Column 2, Line 33, delete "NVM write" and insert --$NVM_{write}$-- therefor In Column 3, Line 42, delete "die1" and insert --$die_1$-- therefor In Column 3, Line 42, delete "die2" and insert --$die_2$-- therefor In Column 3, Line 50, delete "die 222," and insert --220,-- therefor In Column 4, Line 28, delete "nondeterministic" and insert --non-deterministic-- therefor In Column 4, Line 46, delete "NV address" and insert --$NV_{address}$-- therefor In Column 4, Line 47, delete "NVM write" and insert --$NVM_{write}$-- therefor In Column 4, Line 48, delete "NV address" and insert --$NV_{address}$-- therefor In Column 4, Line 64, delete "NVM write" and insert --$NVM_{write}$-- therefor In Column 4, Line 65, delete "NV address" and insert --$NV_{address}$-- therefor Signed and Sealed this
Twenty-fifth Day of June, 2019

Andrei Iancu
*Director of the United States Patent and Trademark Office*

CERTIFICATE OF CORRECTION (continued)
U.S. Pat. No. 9,940,980 B2

In Column 5, Line 2, delete "NV address" and insert --$NV_{address}$-- therefor

In Column 5, Line 22, delete "NVM write" and insert --$NVM_{write}$-- therefor

In Column 6, Line 11, delete "NVM read" and insert --$NVM_{read}$-- therefor

In Column 6, Line 19, delete "NVM md" and insert --$NVM_{read}$-- therefor

In Column 7, Line 30, delete "nondeterministic" and insert --non-deterministic-- therefor In Column 7, Line 37, delete "diet" and insert --$die_1$-- therefor In Column 7, Line 38, delete "die2" and insert --$die_2$-- therefor In Column 7, Line 43, after "needed", insert --.--

In Column 7, Line 54, delete "nondeterministic" and insert --non-deterministic-- therefor In Column 10, Line 29, delete "NVM address" and insert --$NVM_{address}$-- therefor In Column 10, Line 34, delete "NVM address" and insert --$NVM_{address}$-- therefor In Column 11, Line 23, delete "64-16-BL16" and insert --64-16×BL16-- therefor In Column 13, Line 58, delete "processor," and insert --processor;-- therefor